United States Patent
Mikawa et al.

(10) Patent No.: US 6,960,800 B2
(45) Date of Patent: Nov. 1, 2005

(54) SEMICONDUCTOR DEVICE AND METHOD FOR FABRICATING THE SAME

(75) Inventors: Takumi Mikawa, Kyoto (JP); Yuji Judai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/734,176

(22) Filed: Dec. 12, 2000

(65) Prior Publication Data
US 2002/0030243 A1 Mar. 14, 2002

(30) Foreign Application Priority Data
Dec. 13, 1999 (JP) ............................................. 11-353104

(51) Int. Cl.$^7$ ...................... H01L 29/76; H01L 27/108; H01L 29/00; H01L 23/48; H01L 23/52
(52) U.S. Cl. ........................ 257/295; 257/296; 257/532; 257/751; 257/767
(58) Field of Search ............................... 257/532, 295, 257/296, 767, 751

(56) References Cited

U.S. PATENT DOCUMENTS

| | | | | |
|---|---|---|---|---|
| 5,475,248 A | * | 12/1995 | Takenaka ..................... | 257/295 |
| 6,225,185 B1 | * | 5/2001 | Yamazaki et al. ........... | 438/396 |
| 6,515,323 B1 | * | 2/2003 | Jung et al. ................... | 257/295 |
| 6,586,790 B2 | * | 7/2003 | Kanaya et al. ............... | 257/295 |
| 2002/0043677 A1 | * | 4/2002 | Jung ............................. | 257/295 |

FOREIGN PATENT DOCUMENTS

| | | | |
|---|---|---|---|
| EP | 0 766 319 | 4/1997 | ................. 257/295 |
| EP | 0 933 783 | 8/1999 | ................. 257/295 |
| JP | 09-246082 | 9/1997 | |
| JP | 09-280947 | 10/1997 | |
| JP | 11-145410 | 5/1999 | |
| JP | 11-163288 | 6/1999 | |
| JP | 11-214655 | 8/1999 | |
| JP | 11-307733 | 11/1999 | ................. 257/295 |

OTHER PUBLICATIONS

European Search Report, Mar. 15, 2001, 3 pages.

* cited by examiner

*Primary Examiner*—Steven Loke
(74) *Attorney, Agent, or Firm*—Nixon Peabody LLP; Donald R. Studebaker

(57) ABSTRACT

A lower electrode is formed on a substrate, a capacitive insulating film is formed out of a ferroelectric film on the lower electrode, and an upper electrode is formed on the capacitive insulating film. A contact layer is formed on the upper electrode. The contact layer is either a single-layer film made of a metal oxide or a metal nitride or a multilayer structure made up of metal oxide and metal nitride films. An insulating film is formed to cover the lower electrode, capacitive insulating film, upper electrode and contact layer. A contact hole is opened through the insulating film and the contact layer to reach the upper electrode. A metal interconnect, which is filled in the contact hole and connected to the upper electrode, is formed on a part of the insulating film.

11 Claims, 6 Drawing Sheets

SEMICONDUCTOR DEVICE AND METHOD FOR FABRICATING THE SAME

BACKGROUND OF THE INVENTION

The present invention relates to a semiconductor device including a capacitor that has a capacitive insulating film formed out of a ferroelectric film, and also relates to a method for fabricating the device.

In recent years, performance of consumer electronic units is being more and more enhanced, because microcomputers, for example, are now able to operate at much higher speeds with much lower power consumed. To cope with the performance enhancement, semiconductor elements in a semiconductor device have been miniaturized rapidly. Thus, unwanted radiation, i.e., electromagnetic noise generated from the electronic units, is a serious problem.

To reduce the unwanted radiation, a technique of building a capacitor with large capacitance, in which a ferroelectric film with a high dielectric constant is used as a capacitive insulating film, in a semiconductor integrated circuit device, for example, is attracting much attention.

Also, the number of dynamic RAMs (DRAMs) integrated on a chip goes on increasing. In response, a technique of using high-dielectric-constant materials instead of silicon oxides or silicon nitrides, which have been used widely, is now researched broadly.

Further, a ferroelectric film exhibiting spontaneous polarization has also been researched and developed vigorously to implement a nonvolatile RAM that can operate with a lower voltage applied and that can also perform high-speed write and read operations.

The most important problem to be solved in implementing a semiconductor device with a capacitor including a ferroelectric capacitive insulating film is increasing the number of DRAMs integrated on a chip without degrading the characteristic of the capacitor.

In particular, to use noble metals (e.g., Pt, Ir and the like) as electrode materials for a ferroelectric capacitor is a brand-new technique developed over the past few years. Therefore, there are still many problems left to successfully apply this technique to semiconductor device processing for a capacitor including a ferroelectric capacitive insulating film. For example, adhesiveness of the electrode materials like Pt and Ir to an insulating film such as a silicon dioxide or silicon nitride film is not satisfactory. Therefore, the insulating film might peel off if annealing is performed at a high temperature. Also, depending on the type of the undercoat film, the insulating film might peel off right after the insulating film has been deposited. In view of these problems, a contact layer is needed between the Pt or Ir upper electrode and the insulating film of silicon dioxide or nitride. In the prior art, a titanium film, which has often been used in semiconductor device processing, is used as a contact layer.

Hereinafter, a known semiconductor device and a method for fabricating the device will be described with reference to the accompanying drawings.

FIG. 5 illustrates a cross-sectional structure of the principal portion of a known semiconductor device. As shown in FIG. 5, a lower electrode 11, a capacitive insulating film 12, an upper electrode 13 and a contact layer 14 are formed in this order on the semiconductor substrate 10. Each of the lower and upper electrodes 11 and 13 is made of a Pt film, the capacitive insulating film 12 is formed out of a ferroelectric film, and the contact layer 14 is made of a Ti film. And an insulating film 15 made of silicon dioxide or silicon nitride, for example, is deposited over the lower and upper electrodes 11 and 13, capacitive insulating film 12 and contact layer 14.

The lower electrode 11 is connected to a first metal interconnect 17A, which is formed on a part of the insulating film 15 and filled in a first contact hole 16A. And the upper electrode 13 is connected to a second metal interconnect 17B, which is formed on another part of the insulting film 15 and filled in a second contact hole 16B. Each of the first and second metal interconnects 17A and 17B is made up of a lower titanium nitride film and an upper aluminum film. Also, a passivation film 18 of silicon nitride is deposited over all the members described above.

Hereinafter, a method for fabricating the known semiconductor device will be described with reference to FIGS. 6A through 6F.

First, as shown in FIG. 6A, first Pt film 11A, ferroelectric film 12A, second Pt film 13A and Ti film 14A are deposited in this order over a semiconductor substrate 10. Then, the Ti and second Pt films 14A and 13A are patterned to form a contact layer 14 out of the Ti film 14A and an upper electrode 13 out of the second Pt film 13A, respectively, as shown in FIG. 6B.

Next, the ferroelectric and first Pt films 12A and 11A are patterned, thereby forming a capacitive insulating film 12 out of the ferroelectric film 12A and a lower electrode 11 out of the first Pt film 11A, respectively, as shown in FIG. 6C.

Subsequently, as shown in FIG. 6D, an opening 12a is formed in a region of the capacitive insulating film 12 in which a first contact hole 16A will be defined. Then, an insulating film 15 is deposited over the entire surface of the semiconductor substrate 10. Next, the first and second contact holes 16A and 16B are opened through the insulating film 15 to partially expose the lower and upper electrodes 11 and 13, respectively.

The next step is depositing a multilayer structure consisting of a lower titanium nitride film and an upper aluminum film over the insulating film 15 in such a manner that the first and second contact holes 16A and 16B are filled in by the multilayer structure. Then, the multilayer structure is patterned to form the first metal interconnect 17A connected to the lower electrode 11 and the second metal interconnect 17B connected to the upper electrode 13, respectively, as shown in FIG. 6E.

Next, a passivation film 18 of silicon nitride is deposited over the entire surface of the semiconductor substrate 10. In this manner, the known semiconductor device as shown in FIG. 6F is obtained. Although not shown in the drawings, after making openings in the passivation film 18, electrode pads connected to the first and second metal interconnects 17A and 17B are formed. As a result, a series of process steps of fabricating the known semiconductor device is completed.

After the contact layer 14, upper electrode 13, capacitive insulating film 12 and lower electrode 11 are formed by patterning, annealing is usually performed to repair the damage caused by the patterning of the capacitive insulating film 12.

However, as a result of the annealing, Ti atoms that make up the contact layer 14 might diffuse through column-like crystals of Pt in the upper electrode 13 to reach the ferroelectric capacitive insulating film 12. In that case, the polarization properties of the ferroelectric capacitive insulating film 12 might degrade and electrical characteristic of the capacitor including the capacitive insulating film 12 might deteriorate.

In addition, as a result of the annealing, the contact layer 14 will expand, while the upper electrode 13 will shrink. Therefore, a void might be formed in the upper electrode 13 because stress is applied to the upper electrode 13.

SUMMARY OF THE INVENTION

A first object of the present invention is to suppress the degradation in polarization properties of a ferroelectric film for a capacitive insulating film.

A second object of the present invention is to prevent a void from being formed in an upper electrode.

To achieve the first object, an inventive semiconductor device includes: a lower electrode formed on a substrate; a capacitive insulating film formed out of a ferroelectric film on the lower electrode; an upper electrode formed on the capacitive insulating film; a contact layer formed on the upper electrode; an insulating film formed to cover the lower electrode, the capacitive insulating film, the upper electrode and the contact layer; a contact hole passing through the insulating film and the contact layer to reach the upper electrode; and a metal interconnect, which is defined on a part of the insulating film, filled in the contact hole and connected to the upper electrode. In the device, the contact layer is a single-layer film or a multilayer structure. The single-layer film is made of a metal oxide or a metal nitride. And the multilayer structure is made up of metal oxide and metal nitride films.

In the inventive device, the contact layer exists between the upper electrode and the insulating film except the region where the contact hole is opened. And the contact layer is either a single-layer film made of a metal oxide or a metal nitride or a multilayer structure made up of metal oxide and metal nitride films. Therefore, the insulating film is unlikely to peel off the contact layer and metal atoms in the contact layer are unlikely to diffuse into the upper electrode even if annealing is performed in a subsequent process step. In that case, it is hard for the metal atoms in the contact layer to reach the ferroelectric capacitive insulating film. Thus, the degradation in polarization properties of the ferroelectric film can be avoided, and the electric characteristic of the capacitor does not deteriorate.

In one embodiment of the present invention, the upper electrode preferably contains Pt or Ir, the metal oxide film is preferably made of an oxide of Ti or an oxide of Ta, and the metal nitride film is preferably made of a nitride of Ti or a nitride of Ta.

In general, if the upper electrode contains Pt or Ir, the upper electrode is made of column-like crystals, and is likely to allow the metal atoms to diffuse easily. However, an oxide of Ti or Ta or a nitride of Ti or Ta is unlikely to diffuse into the upper electrode. Therefore, the degradation in the polarization properties of the ferroelectric film can substantially be suppressed in such an embodiment.

To achieve the first object, an inventive method for fabricating a semiconductor device includes the steps of: a) depositing a first metal film, a ferroelectric film, a second metal film and a single-layer film or a multilayer structure in this order on a substrate, the single-layer film being made of a metal oxide or a metal nitride, the multilayer structure being made up of metal oxide and metal nitride films; b) patterning the single-layer film or the multilayer structure to form a contact layer; c) patterning the second metal film to form an upper electrode; d) patterning the ferroelectric film to form a capacitive insulating film; e) patterning the first metal film to form a lower electrode; f) depositing an insulating film covering the lower electrode, the capacitive insulating film, the upper electrode and the contact layer; g) opening a contact hole that passes through the insulating film and the contact layer to reach the upper electrode; and h) defining a metal interconnect, which is filled in the contact hole and connected to the upper electrode, on a part of the insulating film.

According to the inventive method, the contact layer exists between the upper electrode and the insulating film except the region where the contact hole will be opened. And the contact layer is either a single-layer film made of a metal oxide or a metal nitride or a multilayer structure made up of metal oxide and metal nitride films. Therefore, the insulating film is unlikely to peel off the contact layer, and metal atoms in the contact layer are unlikely to diffuse into the upper electrode even if annealing is performed in a subsequent process step. In that case, it is hard for the metal atoms in the contact layer to reach the ferroelectric capacitive insulating film. Thus, the degradation in polarization properties of the ferroelectric film can be avoided, and the electric characteristic of the capacitor does not deteriorate.

In one embodiment of the present invention, the single-layer film or the multilayer structure is preferably deposited in the step a) by a sputtering process using a target of a metal oxide or a metal nitride or by a reactive sputtering process performed within an ambient containing oxygen gas or nitrogen gas.

In this manner, it is possible to prevent the metal atoms in the contact layer from diffusing into the upper electrode before bonding to oxygen atoms or nitrogen atoms. Therefore, the degradation in polarization properties of the ferroelectric capacitive insulating film is much more likely to be suppressed.

To achieve the second object, the inventive method for fabricating a semiconductor device preferably further includes the step of annealing the second metal film at a temperature between 300° C. and 800° C.

In this manner, the contact layer is deposited on the capacitor after the second metal film, which will form the upper electrode, has been shrunk. Therefore, the upper electrode will not be shrunk anymore even if annealing is performed in a subsequent semiconductor process step. As a result, stress applied to the upper electrode is lighter than usual, and a void is unlikely to be formed in the upper electrode. In this case, the second metal film, which will form the upper electrode, is most likely to be shrunk because annealing is performed at 300° C. or more, and formation of a hillock in the first and second metal films can be prevented because the anneal temperature is 800° C. or less.

DESCRIPTION OF THE PREFERRED EMBODIMENTS

Hereinafter, a semiconductor device according to a preferred embodiment of the present invention will be described with reference to the accompanying drawings.

Figure 1A:
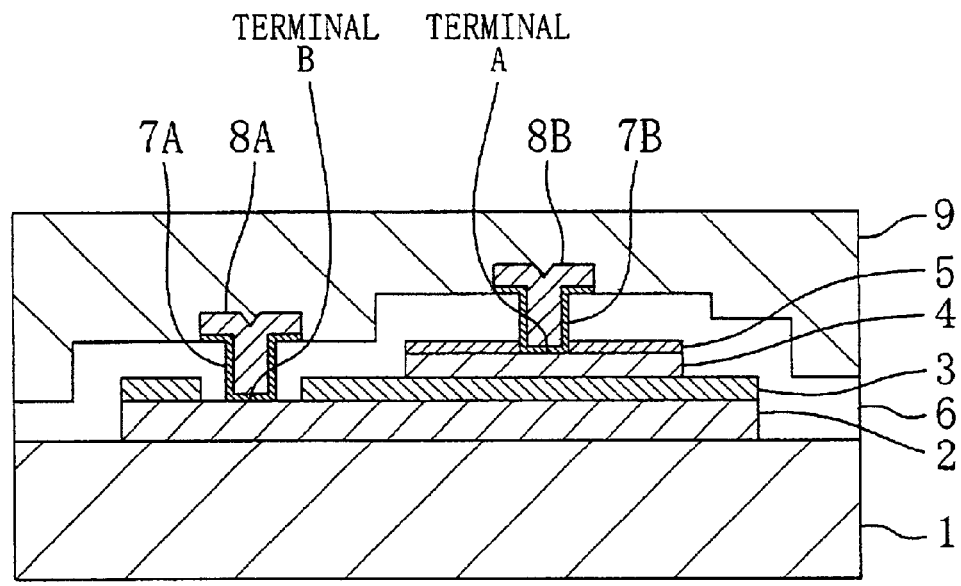
FIG. 1A is a cross-sectional view of a semiconductor device according to an embodiment of the present invention.
Figure 1B:
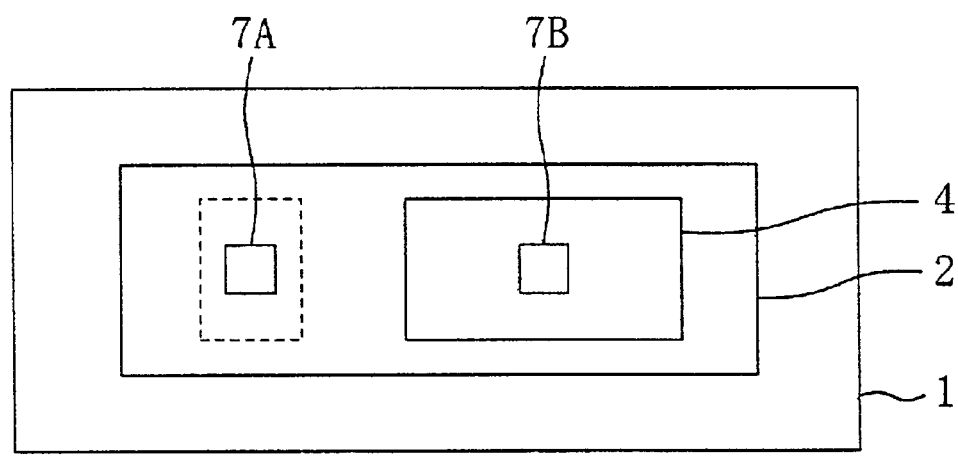
FIG. 1B is a plan view of the device.

FIG. 1A illustrates a cross-sectional structure of the device of this embodiment. A capacitor, formed on a semiconductor substrate 1, consists of: lower and upper electrodes 2 and 4, each of which is made of a Pt film; and a capacitive insulating film 3 of a ferroelectric like $SrBi_2Ta_2O_9$.

A contact layer 5 made of TiN is formed on the upper electrode 4. And an insulating film 6 of silicon dioxide or nitride covers the lower and upper electrodes 2 and 4, capacitive insulating film 3 and contact layer 5.

The lower electrode 2 is connected to a first metal interconnect 8A, which is formed on a part of the insulating film 6 and filled in a first contact hole 7A. And the upper electrode 4 is connected to a second metal interconnect 8B, which is formed on another part of the insulating film 6 and filled in a second contact hole 7B. Each of the first and second metal interconnects 8A and 8B is made up of a lower titanium nitride film and an upper aluminum film. Also, a passivation film 9 made of silicon nitride is deposited over all the members described above.

According to this embodiment, the contact layer 5 of TiN is formed on the upper electrode 4. Therefore, almost none of the metal atoms in the contact layer 5 diffuses through the upper electrode 4 to reach the capacitive insulating film 3, even if annealing is performed in a subsequent process step. Accordingly, electrical characteristic of the capacitor does not deteriorate because the polarization properties of the ferroelectric capacitive insulating film 3 do not degrade.

In this embodiment, the contact layer 5 does not exist inside the second contact hole 7B, which connects the second metal interconnect 8B to the upper electrode 4. This is because the contact layer 5 is supposed to exist only partially between the upper electrode 4 and the insulating film 6 to such an extent that the insulating film 6 will not peel off the upper electrode 4 in a subsequent process step. Therefore, the contact layer 5 does not have to exist inside the second contact hole 7B.

We measured the polarization of the ferroelectric film to evaluate the effects of this embodiment. The results of the measurement will be described with reference to the drawings. We used capacitor with no contact layer, capacitor with a contact layer of TiN, and capacitor with a contact layer of Ti as samples for the measurement. None of these capacitors had the insulating film 6, first and second contact holes 7A and 7B, first and second metal interconnects 8A and 8B and passivation film 9. We measured the polarization of the ferroelectric film at the terminals A and B shown in FIG. 1A.

Figure 2:
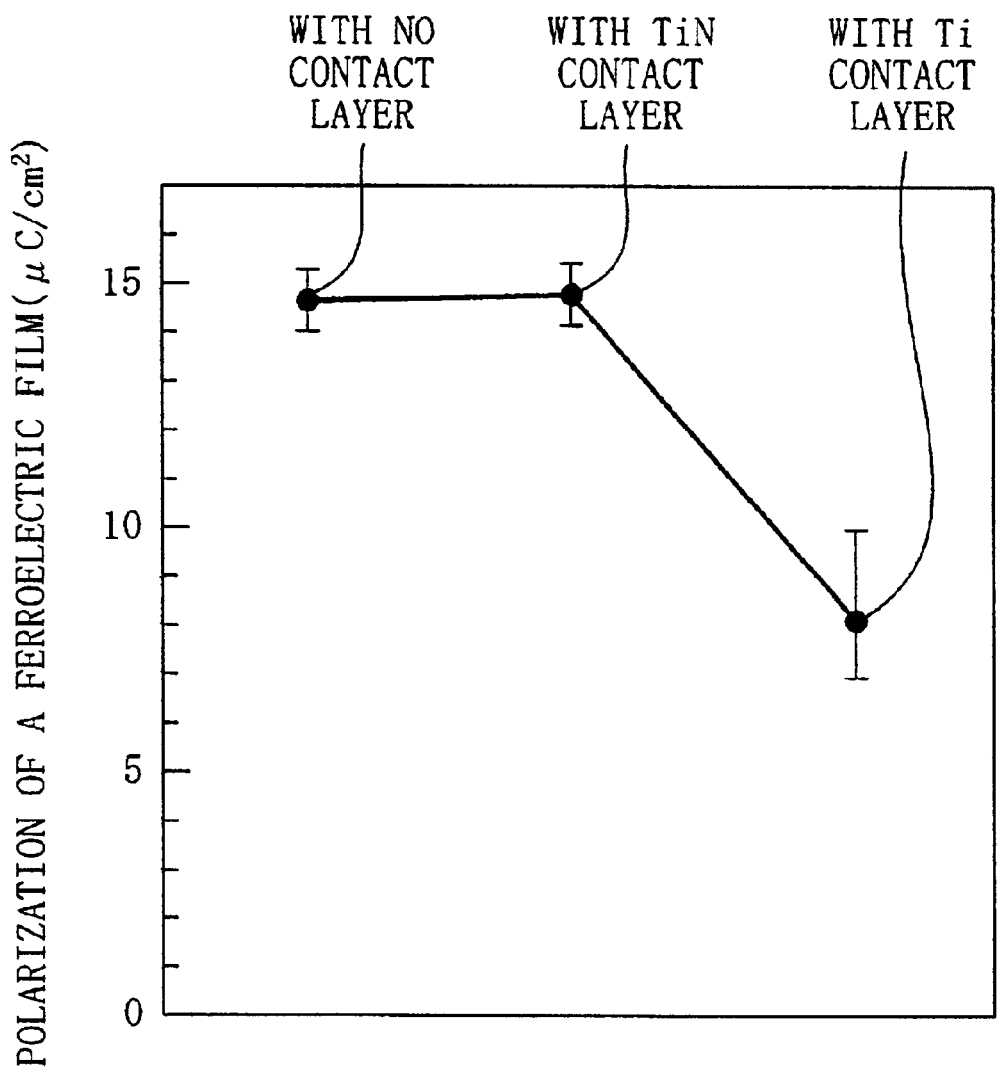
FIG. 2 is a graph illustrating the polarization of a ferroelectric film, which was measured to evaluate the device according to the embodiment.

The polarization of the capacitor with the TiN contact layer and that of the capacitor with no contact layer, which was hardly affected by diffused Ti atoms, were at almost the same levels as shown in FIG. 2. Specifically, the polarization of these capacitors measured 14 $\mu C/cm^2$ or more, and a variation of 1.5 $\mu C/cm^2$ or less was observed. In contrast, the capacitor with the Ti contact layer showed a polarization of about 8 $\mu C/cm^2$ and a variation of 3 $\mu C/cm^2$.

We ascertained from those results that it is possible to prevent the metal atoms in the contact layer 5 from diffusing and thereby suppress the degradation in polarization of the ferroelectric capacitive insulating film 3 by using the capacitor of this embodiment, even if annealing is performed in a subsequent process step of a semiconductor process.

It should be noted that the TiN contact layer 5 is used in this embodiment. Alternatively, single-layer film made of a metal nitride like TaN, single-layer film made of a metal oxide such as $TiO_x$, or multilayer structure made up of metal nitride and metal oxide films may also be used. This is because the metal atoms in the contact layer 5 will not diffuse either with any of these films even if annealing is performed in a subsequent process step. It should also be noted that Ta behaves like Ti when diffusing.

Hereinafter, a first method for fabricating the device according to the embodiment will be described. The first and known methods differ just in the composition of a contact layer and in the method of depositing the contact layer. Therefore, only the difference in the method of depositing the contact layer will be described.

The first method is characterized in that the contact layer 5 is deposited by a sputtering process using a target of a metal nitride like TiN or a metal oxide such as $TiO_x$. The contact layer 5 may be either a single-layer film made of a metal nitride or a metal oxide or a multilayer structure made up of metal oxide and metal nitride films.

Hereinafter, it will be described what is the difference between depositing a metal nitride or oxide film by a sputtering process using a target of a metal nitride or oxide and depositing a metal film like a Ti film and then nitriding or oxidizing the film.

If a metal film is nitrided or oxidized to form a metal nitride or oxide film, metal atoms (e.g., Ti atoms) in the metal film might diffuse into the upper electrode 4 before bonding to nitrogen or oxygen atoms. Therefore, the polarization properties of the capacitive insulating film 3 might degrade. In contrast, if a metal nitride or oxide film is deposited by a sputtering process using a target of a metal nitride or oxide, almost none of the metal atoms will diffuse into the upper electrode 4. Therefore, the degradation in polarization of the capacitive insulating film 3 is much more likely to be suppressed.

We measured the polarization of a ferroelectric film to evaluate the first method. The results of the measurement will be described with reference to FIG. 3. We used four capacitors as samples for the measurement. Specifically, we used a capacitor with a contact layer of TiN deposited by a sputtering process and a capacitor with a contact layer of TiN formed by nitriding a Ti film. We also used a capacitor with a contact layer of $TiO_x$ deposited by a sputtering process and a capacitor with a contact layer of $TiO_x$ formed by oxidizing a Ti film.

Figure 3:
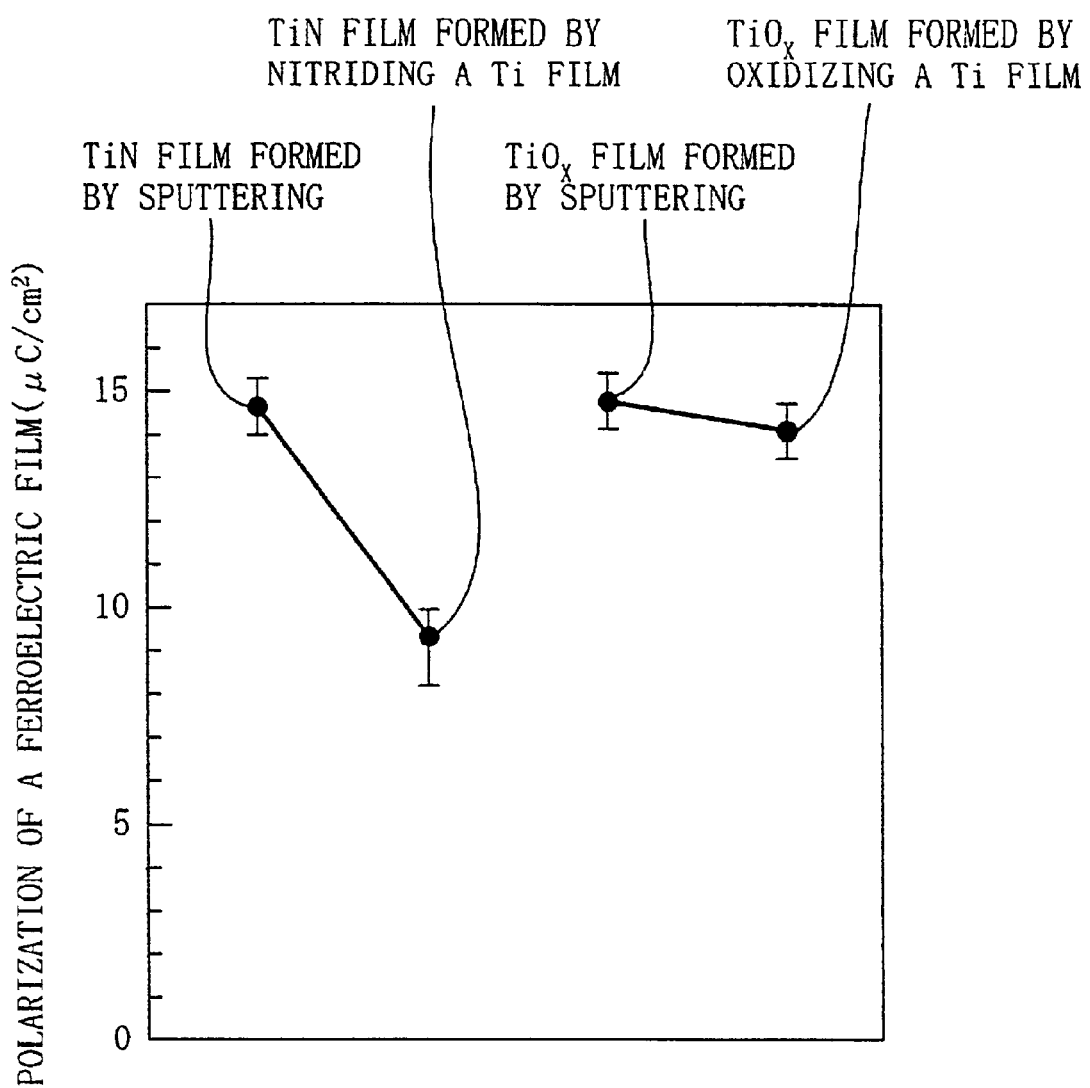
FIG. 3 is a graph illustrating the polarization of a ferroelectric film, which was measured to evaluate a first method for fabricating the device according to the embodiment.

As shown in FIG. 3, the polarization of the ferroelectric film with the TiN or $TiO_x$ contact layer deposited by the sputtering process was almost the same as that of the ferroelectric film with no contact layer shown in FIG. 2. However, the polarization of the ferroelectric film with the contact layer formed by nitriding or oxidizing the Ti film is smaller than that of the ferroelectric film with the TiN or $TiO_x$ contact layer deposited by the sputtering process. Further, the decrease of the polarization where the contact layer is formed by oxidizing the Ti film is smaller than that of the polarization where the contact layer is formed by nitriding the Ti film. This is because O atoms rapidly bond to Ti atoms to form $TiO_x$ when oxidation is performed, whereas N atoms do not bond rapidly to Ti atoms when nitriding is performed.

According to the first method, a sputtering process is performed using a target of a metal nitride like TiN or a metal oxide such as $TiO_x$ to deposit a metal nitride or oxide film. Alternatively, sputtering may also be performed using a target of a metal nitride like TaN or a metal oxide such as $TaO_x$ to deposit another metal nitride or oxide film.

In addition, a sputtering process is performed using a target of a metal nitride or oxide according to the first method. Alternatively, a reactive sputtering process may also be performed to deposit another metal nitride or oxide film within a $N_2$ or $O_2$ gas ambient using a target of a metal such as Ti or Ta.

Hereinafter, a second method for fabricating the device according to the embodiment will be described.

First, first metal film of Pt, for example, ferroelectric film and second metal film of Pt, for instance, are formed in this order on the semiconductor substrate 1. Then, the second metal film, ferroelectric film and first metal film are patterned sequentially to form upper electrode, capacitive insulating film and lower electrode, respectively.

Next, annealing is performed at a temperature between 300° C. and 800° C. to relax the internal stress of the upper and lower electrodes and to shrink these electrodes. Then, a contact layer of a metal nitride like TiN or a metal oxide such as $TiO_x$ is deposited on the upper electrode and patterned. Thereafter, an insulating film, contact holes and metal interconnects are formed as in the known process.

According to the second method, the contact layer is deposited on the capacitor after the upper electrode of the capacitor has been shrunk by annealing the capacitor. Therefore, the upper electrode will not be shrunk anymore even if annealing is performed in a subsequent semiconductor process step. As a result, a void is unlikely to be formed in the upper electrode because stress applied to the upper electrode is lighter than usual.

According to the second method, annealing is performed at a temperature between 300° C. and 800° C. after the capacitor, which is made up of the upper and lower electrodes and the capacitive insulating film, has been formed. Alternatively, the second metal film, which will form the upper electrode, may be annealed at a temperature between 300° C. and 800° C. In such an alternative embodiment, the same effects can also be obtained.

Hereinafter, it will be described why the anneal temperature is preferably between 300° C. and 800° C.

Figure 4:
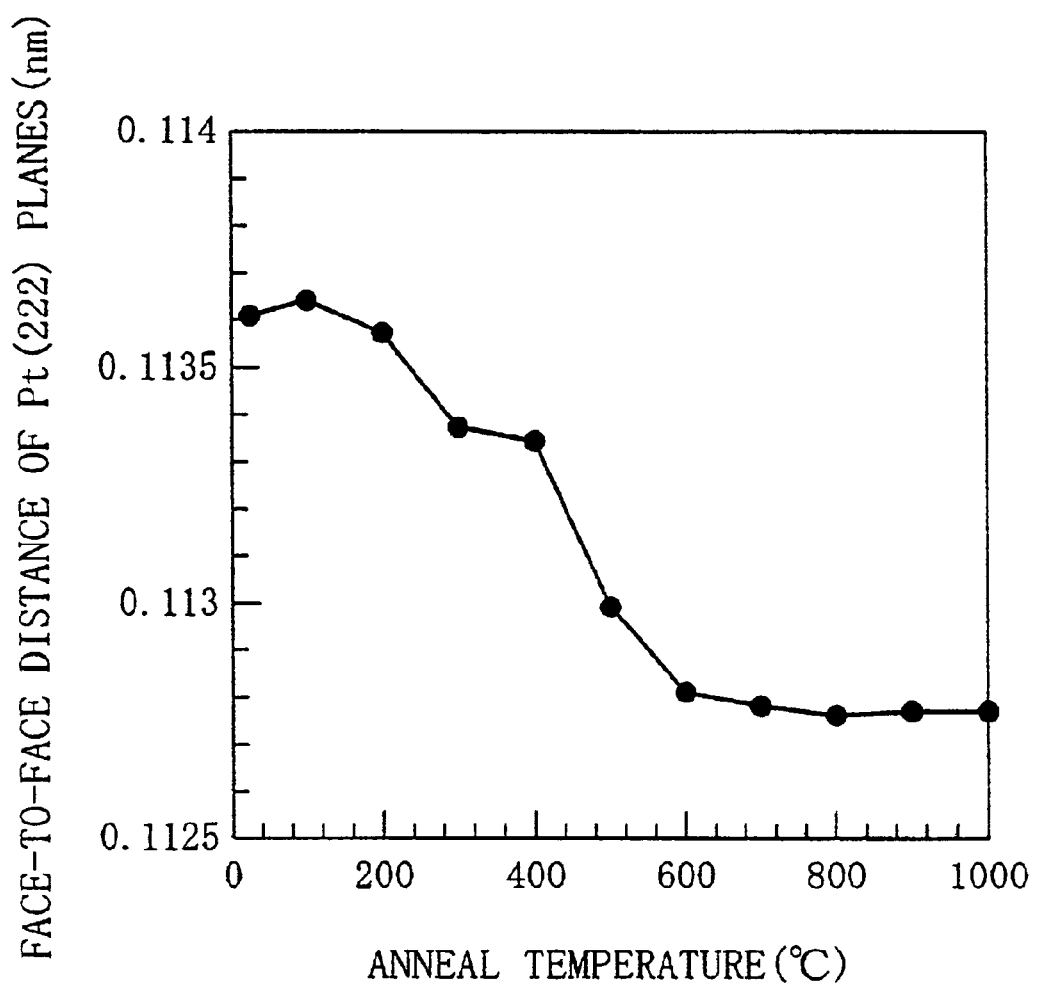
FIG. 4 is a graph illustrating a relationship between the anneal temperature and the face-to-face distance of Pt (222) planes, which was analyzed to test the anneal temperatures by a second method for fabricating the device according to the embodiment.
Figure 5:
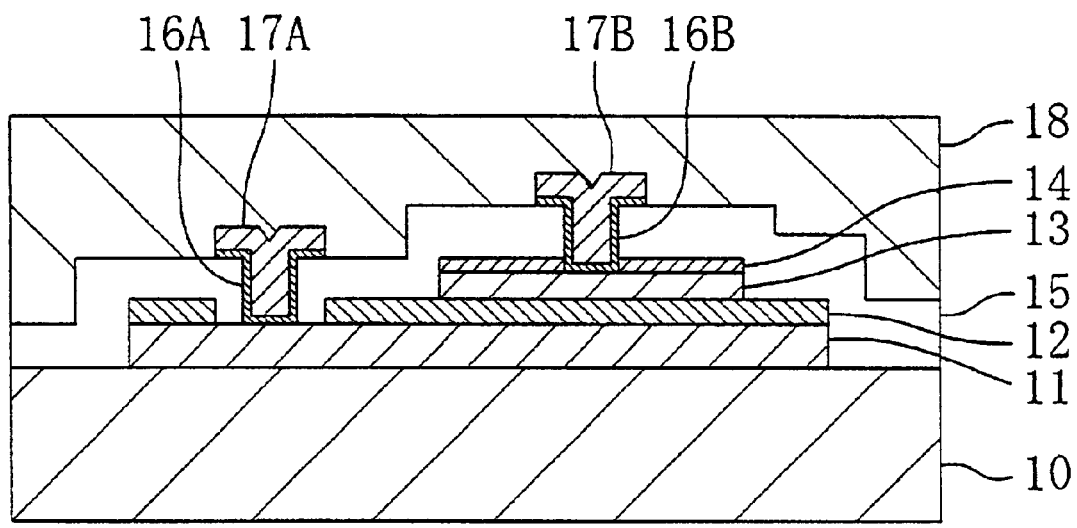
FIG. 5 is a cross-sectional view of a known semiconductor device.
Figure 6A:
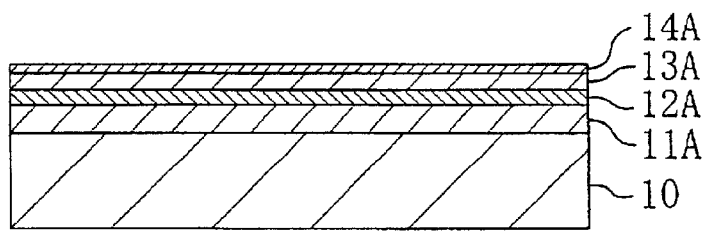
FIGS. 6A through 6F are cross-sectional views illustrating respective process steps of fabricating the known device.
Figure 6B:
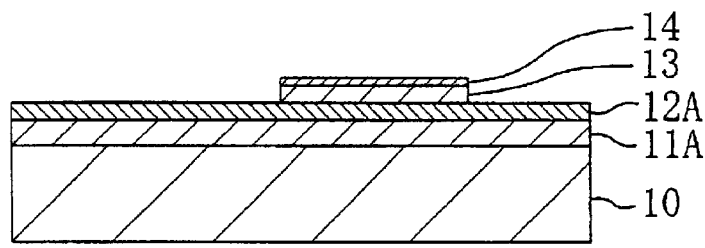
Figure 6C:
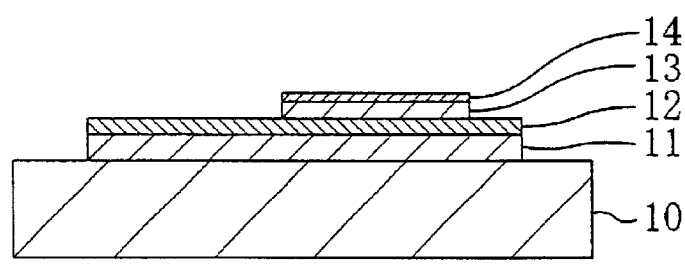
Figure 6D:
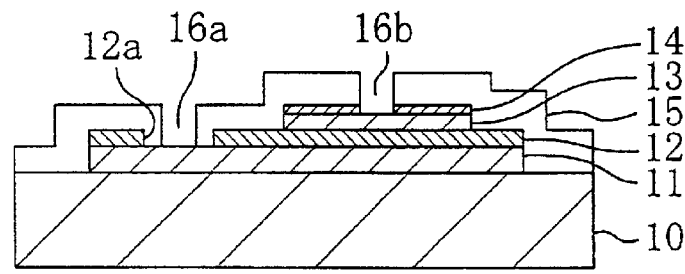
Figure 6E:
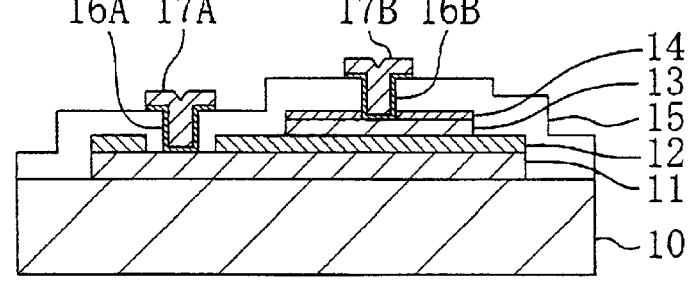
Figure 6F:
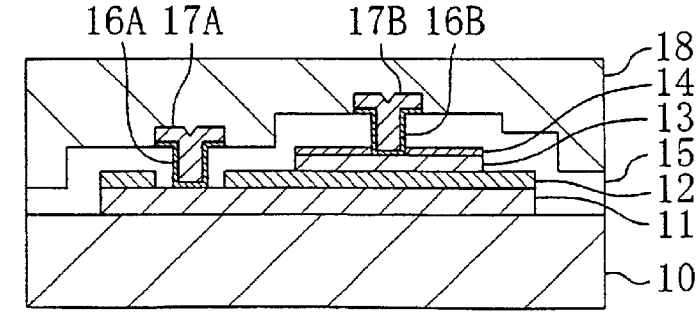

FIG. 4 illustrates a relationship between the anneal temperature (° C.) and the face-to-face distance (nm) between (222) Pt crystal planes. It can be seen from FIG. 4 that the higher the anneal temperature, the shorter the face-to-face distance and that the face-to-face distance decreased by about $3.0 \times 10^{-4}$ nm when annealing was performed at about 300° C. It can also be seen from FIG. 4 that the decrease of the face-to-face distance converged when the anneal temperature was 600° C. or more. Thus, it can be seen that the higher the anneal temperature, the shorter the interstitial distance of the Pt crystals and a Pt film for the upper and lower electrodes shrinks.

Furthermore, we analyzed a relationship between the anneal temperature and the formation of a void, and we found that the formation of a void can be suppressed if the anneal temperature is 300° C. or more. We also found that a hillock will be formed if annealing is performed at a relatively high temperature of 800° C. or more.

For these reasons, the anneal temperature is preferably between 300° C. and 800° C.

What is claimed is:

1. A semiconductor device comprising:

a lower electrode formed on a substrate;

a capacitive insulating film made of a ferroelectric film on the lower electrode;

an upper electrode formed on the capacitive insulating film;

a contact layer formed directly on the upper electrode so as not to be in contact with the capacitive insulating film;

an insulating film made of silicon dioxide or nitride formed directly on the contact layer to cover the lower electrode, the capacitive insulating film, the upper electrode and the contact layer, and wherein the contact layer is provided on a surface of the upper electrode and in a region other than the region where a metal interconnect is connected to the upper electrode, and wherein the contact layer is a single layer film or a multilayer structure, the single-layer film being made of a metal oxide or a metal nitride, the multilayer structure being made up of metal oxide and metal nitride films.

2. The device of claim 1, wherein the metal oxide film is made of an oxide of Ti or an oxide of Ta, while the metal nitride film is made of a nitride of Ti or a nitride of Ta.

3. The device of claim 1, wherein the ferroelectric film includes $SrBi_2Ta_2O_9$.

4. The device of claim 1, wherein the insulating film is unlikely to peel off due to the contact layer.

5. The device of claim 1, wherein the contact layer is made from metal atoms which are unlikely to diffuse into the upper electrode.

6. The device of claim 1, wherein a portion of an upper surface of the upper electrode is not covered by the contact layer and connected to the metal interconnect.

7. The device of claim 1, wherein a portion of an upper surface of the capacitive insulating film is covered by the insulating film.

8. A semiconductor device comprising:

a lower electrode formed on a substrate;

a capacitive insulating film made of a ferroelectric film on the lower electrode;

an upper electrode formed on the capacitive insulating film;

a contact layer formed directly on the upper electrode so as to be in no contact with the capacitive insulating film, and an insulating film made of silicon dioxide or nitride formed directly on the contact layer to cover the lower electrode, the capacitive insulating film, the upper electrode and the contact layer, wherein a portion of the upper surface of the upper electrode is not covered by the contact layer and connected to a metal interconnect, and wherein the contact layer is a single-layer film or a multilayer structure, the single-layer film being made of a metal oxide or a metal nitride, the multilayer structure being made up of metal oxide and metal nitride films.

9. The device of claim 8, wherein the metal oxide film is made of an oxide of Ti or an oxide of Ta, while the metal nitride film is made of a nitride of Ti or a nitride of Ta.

10. The device of claim 8, wherein a portion of an upper surface of the capacitive insulating film is covered by the insulating film.

11. A semiconductor device comprising:
- a lower electrode formed on a substrate;
- a capacitive insulating film made of a ferroelectric film on the lower electrode,
- an upper electrode formed on the capacitive insulating film; and
- a contact layer formed directly on the upper electrode so as to be in no contact with the capacitive insulating film, wherein the entire upper surface of the upper electrode is in no contact with an insulating film, and wherein the contact layer is made from TaO or TaN.

* * * * *